(12) United States Patent
Aisenbrey (10) Patent No.: US 7,002,234 B2
(45) Date of Patent: Feb. 21, 2006

(54) LOW COST CAPACITORS MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 40 days.

(21) Appl. No.: 10/825,988

(22) Filed: Apr. 16, 2004

(65) Prior Publication Data

US 2004/0217405 A1 Nov. 4, 2004

Related U.S. Application Data

(63) Continuation-in-part of application No. 10/309,429, filed on Dec. 4, 2002, which is a continuation-in-part of application No. 10/075,778, filed on Feb. 14, 2002, now Pat. No. 6,741,221.

(60) Provisional application No. 60/269,414, filed on Feb. 16, 2001, provisional application No. 60/317,808, filed on Sep. 7, 2001, provisional application No. 60/463,362, filed on Apr. 16, 2003, provisional application No. 60/478,772, filed on Jun. 16, 2003, provisional application No. 60/268,822, filed on Feb. 15, 2001.

(51) Int. Cl.
*H01L 29/00* (2006.01)

(52) U.S. Cl. .................... 257/532; 438/393; 361/306.1

(58) Field of Classification Search ................ 257/532; 438/393; 361/306.1
See application file for complete search history.

(56) References Cited

U.S. PATENT DOCUMENTS 4,876,140 A * 10/1989 Quackenbush .............. 428/216
6,281,781 B1 * 8/2001 Yamaguchi ................. 337/401
6,473,293 B1 10/2002 Shimada et al. ............ 361/523

(Continued)

FOREIGN PATENT DOCUMENTS

GB 2377449 A 1/2003

OTHER PUBLICATIONS

"Solid Polymer Aluminum Capacitor Chips in DC-DC Converter Modules Reduce Cost and Size and Improve High-Frequency Performance," PCIM Electronics 2001 Proc., Sep. 2001, pp. 1-8, Macomber et al.

(Continued)

*Primary Examiner*—Douglas A. Wille
(74) *Attorney, Agent, or Firm*—George O. Saile; Stephen B. Ackerman; Douglas R. Schnabel (57) ABSTRACT

Capacitors are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like.

49 Claims, 5 Drawing Sheets

U.S. PATENT DOCUMENTS

| | | |
|---|---|---|
| 6,489,062 B1 * | 12/2002 | Watanabe et al. ...... 429/231.95 |
| 6,671,165 B1 | 12/2003 | Nakazawa et al. .......... 361/502 |
| 6,680,007 B1 | 1/2004 | Honda et al. ................ 252/511 |
| 6,690,572 B1 | 2/2004 | Liebowitz ................... 361/311 |
| 2002/0049274 A1 * | 4/2002 | Azechi et al. .............. 524/440 |

OTHER PUBLICATIONS

"Improvements With Polymer Cathodes in Aluminum and Tantalum Capacitors," IEEE 2001 APEC Conf. 2001, pp. 1-9, Prymak.

* cited by examiner

LOW COST CAPACITORS MANUFACTURED FROM CONDUCTIVE LOADED RESIN-BASED MATERIALS

This patent application claims priority to the U.S. Provisional Patent Application 60/463,362, filed on Apr. 16, 2003, and to the U.S. Provisional Patent Application 60/478,772, filed on Jun. 16, 2003, which are herein incorporated by reference in their entirety.

This patent application is a Continuation-in-Part of U.S. patent application Ser. No. 10/309,429, filed on Dec. 4, 2002, also incorporated by reference in its entirety, which is a Continuation-in-Part application U.S. patent application Ser. No. 10/075,778 now U.S. Pat. No. 6,741,221, filed on Feb. 14, 2002, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to capacitors and, more particularly, to capacitors molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Capacitors are used very frequently in the art of electrical and electronic circuits. Capacitors are used for timing circuits, A.C. coupling, filtering, noise de-coupling, and charge storage. Capacitors are passive electronics devices capable of storing energy in the form of an electrostatic field. Capacitors are typically formed as parallel metal plates, or electrodes, separated by an insulator. The insulator is called a dielectric. Typical dielectrics include ceramic, mica, polyester, paper, and air. Capacitor values are measured in capacitance or Farads. Capacitance is directly proportional to the surface area of the parallel plates and is inversely proportional to the distance between the plates. Capacitors conduct no current at steady-state D.C. operation. However, during charging and discharging, capacitors can conduct substantial current. Charge can be stored on a capacitor for substantial time depending on the amount of leakage current through the dielectric and/or at circuit elements connected to the metal plates. In typical circuit applications, discrete capacitors are either surface mounted or are inserted into circuit boards and then are soldered permanently into place.

Several prior art inventions relate to capacitor devices. U.S. Pat. No. 6,690,572 B2 to Liebowitz teaches a capacitor with electrodes formed by high temperature sintering of a metal/ceramic filled paste. U.S. Pat. No. 6,671,165 B1 to Nakazawa et al teaches a capacitor with electrodes made of activated carbon. U.S. Pat. No. 6,473,293 B2 to Shimada et al teaches an electrolytic capacitor with one terminal comprising a conductive polymer. U.S. Pat. No. 6,680,007 B2 to Honda et al teaches a conductive resin composition. In the article entitled, "Solid Polymer Aluminum Capacitor Chips in DC-DC Converter Modules Reduce Cost and Size and Improve High-Frequency Performance," PCIM Power Electronics 2001 Proceedings, September 2001, pp. 1–8, Macomber et al teaches a solid, highly conductive polymer that replaces the liquid electrode of the electrolytic capacitor. In the article entitled, "Improvements with Polymer Cathodes in Aluminum and Tantalum Capacitors," IEEE 2001 APEC Conference 2001, pp. 1–9, Prymak teaches a polymer cathode in a capacitor.

SUMMARY OF THE INVENTION

A principal object of the present invention is to provide effective capacitors.

A further object of the present invention is to provide a method to form capacitors.

A further object of the present invention is to provide capacitors molded of conductive loaded resin-based materials.

A yet further object of the present invention is to provide capacitors molded of conductive loaded resin-based material where the capacitors characteristics can be altered or the visual characteristics can be altered by forming a metal layer over the conductive loaded resin-based material.

A yet further object of the present invention is to provide methods to fabricate capacitors from conductive loaded resin-based material incorporating various forms of the material.

A yet further object of the present invention is to provide a method to fabricate capacitors from conductive loaded resin-based material where the material is in the form of a fabric.

A yet further object of the present invention is to provide a method to replace discrete capacitors with capacitors molded into a circuit.

In accordance with the objects of this invention, a capacitor device is achieved. The device comprises a first plate comprising a conductive loaded, resin-based material comprising conductive materials in a base resin host. A second plate is fixably held nearby but not contacting the first plate such that the first plate and the second plate are capacitively coupled.

Also in accordance with the objects of this invention, A capacitor device is achieved. The device comprises a first plate comprising a conductive loaded, resin-based material comprising conductive materials in a base resin host. A second plate comprise the conductive loaded, resin-based material. A dielectric material is between the first plate and the second plate. The first plate and the second plate are capacitively coupled.

Also in accordance with the objects of this invention, a method to form a plate of a capacitor device is achieved. The method comprises providing a conductive loaded, resin-based material comprising conductive materials in a resin-based host. The conductive loaded, resin-based material is molded into a plate for a capacitor device.

BRIEF DESCRIPTION OF THE DRAWINGS

In the accompanying drawings forming a material part of this description, there is shown.

DESCRIPTION OF THE PREFERRED EMBODIMENTS

This invention relates to capacitors molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of capacitors fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the capacitor devices are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of capacitors significantly lowers the cost of materials and the design and manufacturing processes used to hold ease of close tolerances, by forming these materials into desired shapes and sizes. The capacitors can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the capacitors and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming capacitors that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in capacitor applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, capacitors manufactured from the molded conductor loaded resin-based material can provide added thermal dissipation capabilities to the application. For example, heat can be dissipated from electrical devices physically and/or electrically connected to capacitors of the present invention.

Figure 1A:
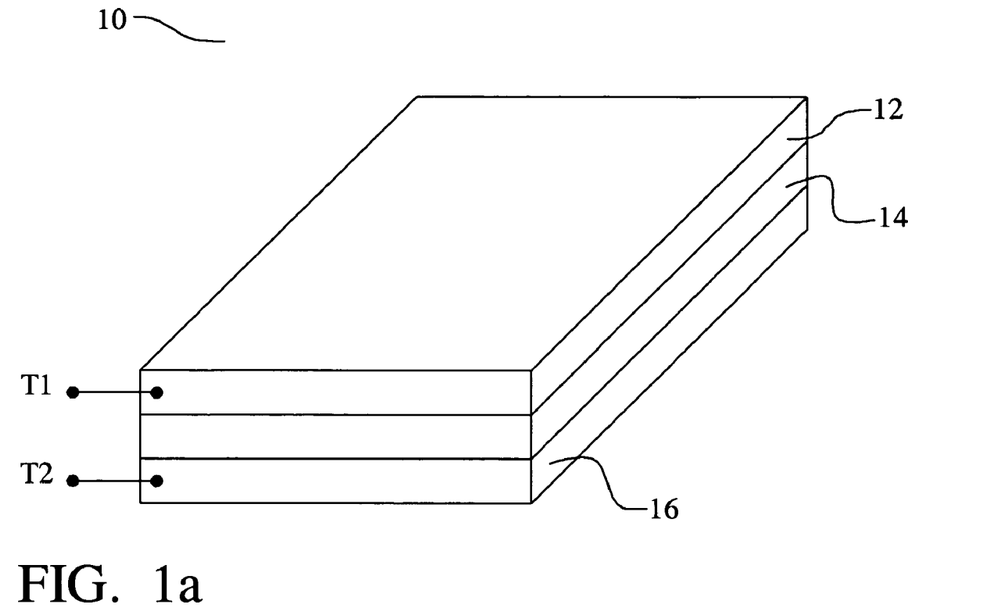
FIGS. 1a and 1b illustrate a first preferred embodiment of the present invention showing capacitors comprising a conductive loaded resin-based material.
Figure 1B:
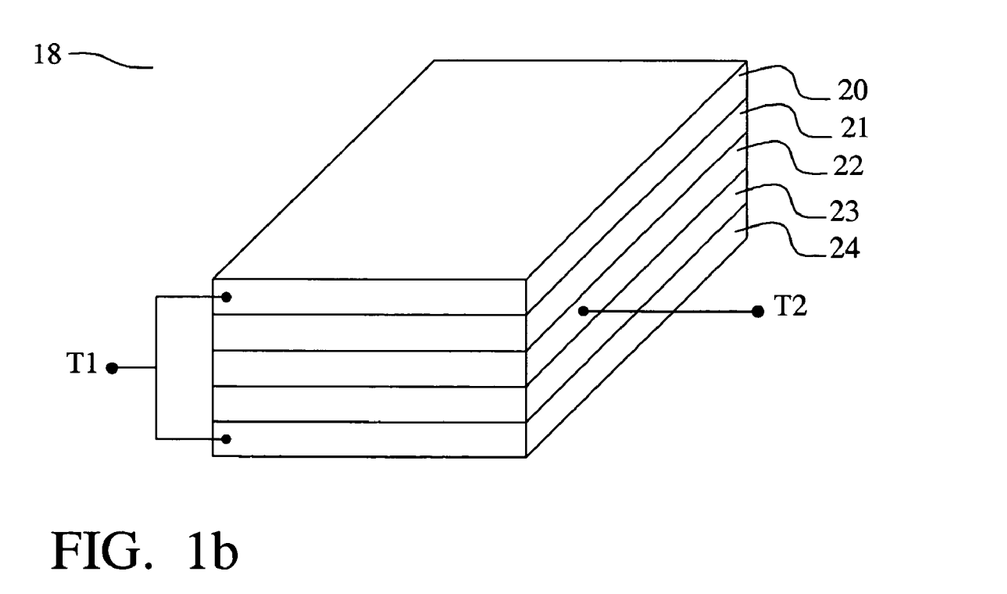

Referring now to FIGS. 1a and 1b, a first preferred embodiment of the present invention is illustrated. Several important features of the present invention are shown and discussed below. Referring now to FIG. 1a, a capacitor device, or capacitor enhanced circuit section, 10 is formed of conductive loaded resin-based material according to the present invention. More particularly, the capacitor 10 comprises plates 12 and 16 of conductive loaded resin-based material where the plates are separated by a dielectric layer 14. In the preferred case, the dielectric layer 14 comprises a resin-based material and, more preferably, comprises the same base resin as is used in the plates 12 and 16. The capacitor 10 is preferably a molded device and is more preferably molded onto or into a circuit where the conductive loaded resin-based material provides electrical connection.

For example, the lower plate 16 or terminal (T2) of the capacitor 10 is injection molded of conductive loaded resin-based material. Next, the dielectric layer 14, comprising the same base resin material but without the conductive loading, is over-molded onto the lower plate 16. Finally, the upper plate 12 or terminal (T1) is over-molded onto the dielectric layer 14. Preferably, the upper and lower plates 12 and 16 comprise the same composition of conductive loaded resin-based material but this is not essential to the present invention. Alternatively, the dielectric layer 14 may be any type of insulator exhibiting a dielectric constant value in the needed range for the particular capacitor. For example, a layer of ceramic, mica, polyester, or paper may be used as the dielectric layer 14. Alternatively, the top and bottom plates 12 and 16 may be separated only by air 14. In this case, the air 14 is the used as the dielectric. The dielectric layer 14 may be applied by over-molding, extrusion, spraying, dipping, coating, or insertion (as in the case of paper). Conversely, the upper and lower plates 12 and 16 may be over-molded onto a previously formed dielectric layer 14. For example, a thin layer of ceramic 14 may first be formed. Then, upper and lower plates of conductive loaded resin-based material 12 and 16 may be over-molded onto the ceramic dielectric 14. Alternatively, upper and lower plates 12 and 16 may be extruded over a pre-formed dielectric layer 14. The plates 12 and 16 may formed as a continuous piece of conductive loaded resin-based material surrounding a dielectric layer 14 and then trimmed, cut, stamped, milled, or the like, to electrically separate the upper and lower plates 12 and 16 and to complete the capacitor.

Referring now to FIG. 1b, multiple layers of conductive loaded resin-based material 20, 22, and 24 may be used to form a laminated stack 18. Here, the middle layer 22 of the stack is one capacitor plate or terminal (T2), while the upper most and lower most layers of conductive loaded resin-based material 20 and 24 are connected together to form the other capacitor plate (T1). Dielectric layers 21 and 23 are used to separate the capacitor plates 20, 22, and 24. Molding techniques, such as calendaring, that are useful for forming sheets of resin-based material, may be used according to the present invention to form sheets of conductive loaded resin-based material 20, 22, and 24, which can then be stacked with intervening dielectric layers 21 and 23 to form large value capacitors. For example, the stack 18 may be bound together using ultrasonic welding.

The conductive loaded resin-based capacitor plates 20, 22, and 24 of the present invention allow the capacitor devices to be molded into a circuit or a circuit housing. Further, these plates can be formulated to exhibit excellent corrosion and/or electrolysis resistance and/or moisture penetration resistance such that the resulting capacitor structure can be used in environmentally challenging environments. For example, by selecting a corrosion resistant base resin and a corrosion resistant conductive load, such as stainless steel, the resulting capacitor plates 20, 22, and 24, can be made corrosion resistant. In addition, the resistivity of the conductive loaded resin-based material can be easily optimized by altering the ratio of doping material to base-resin material. In this way, a passive resistance value can be built into the capacitor plates 20, 22, and 24. The ability to mold the capacitor devices into the circuit or housing facilitates reducing the number of discrete capacitor components in a circuit to thereby reduce part count, tooling costs, and assembly complexity. As yet another alternative, the inner plate 22 may comprise any conductive material including a metallic material. In this case, a dielectric layer 21 and 23 may be coated onto the metal inner plate 22. Then a conductive loaded resin based material 20 and 24 is simply over-molded onto the metal inner plate 22 with a dielectric coating 21 and 23 therebetween to form the capacitor 18.

Figure 7A:
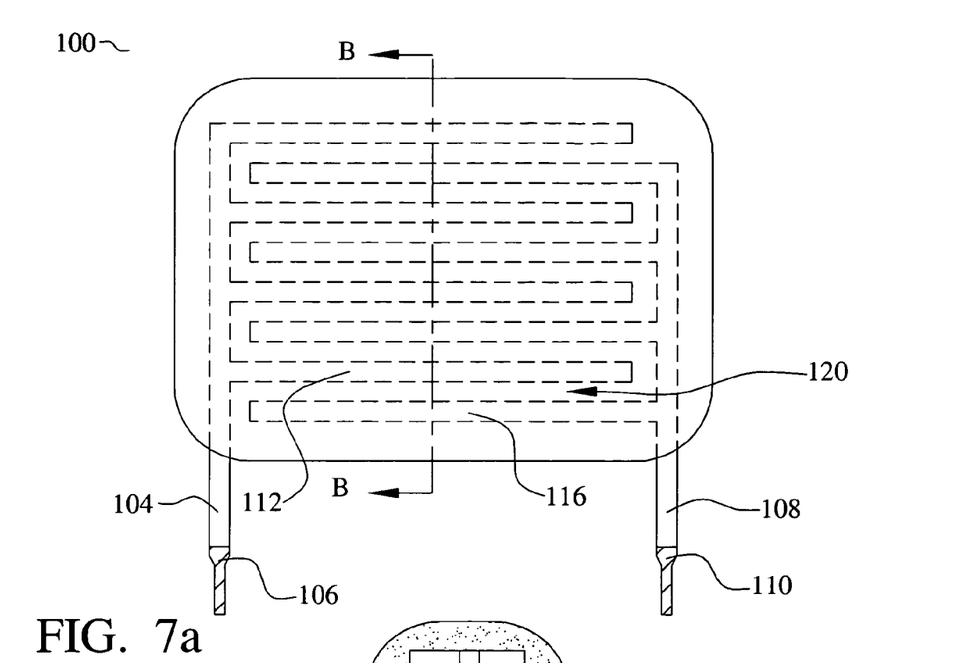
FIGS. 7a and 7b illustrates a second preferred embodiment of the present invention showing a capacitor.
Figure 7B:
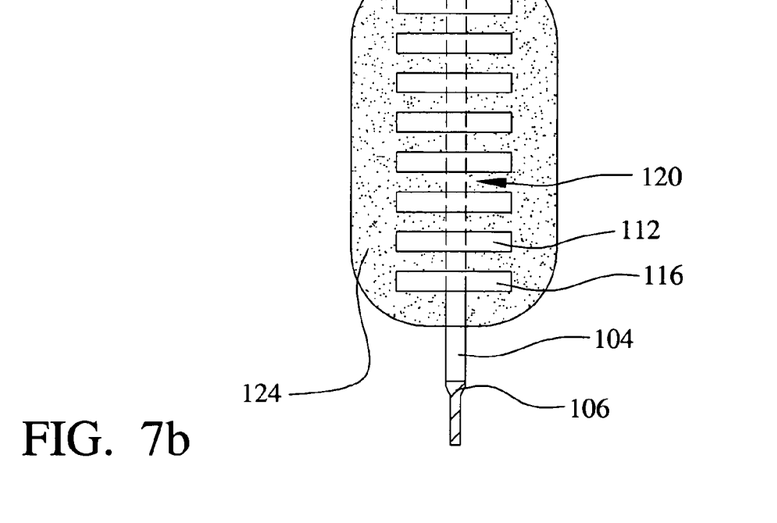

Referring now to FIGS. 7a and 7b, a second preferred embodiment 100 of the present invention is illustrated. A capacitor device 100 is shown. In this case, a discrete capacitor 100 molded of conductive loaded resin-based material is shown. The capacitor 100 comprises a first plate 112 and a second plate 116 further comprising conductive loaded resin-based material according to the present invention. The first and second plates 112 and 116 are formed as a plurality of interlaced fingers or sections to create a large amount of parallel surface area between each plate. A dielectric layer 120 is formed between the plates 112 and 116 to prevent shorting. Preferably, the first and second plates 112 and 116 are molded of the conductive loaded resin-based material. Then a dielectric layer 120 of a resin-based material is over-molded onto the plates 112 and 116 to encapsulate the plates 112 and 116. More preferably, the base resin of the dielectric layer 120 and of the conductive loaded resin-based material 112 and 116 is the same composition to improve bonding. Alternatively, the dielectric layer 120 is applied by coating, spraying, or dipping to encapsulate the plates 112 and 116.

In the preferred embodiment, the discrete capacitor device 100 comprises through-hole leads 104 and 108. Alternatively, surface mount leads may be formed. As an important, but optional feature, a solderable layer 106 and 110 is formed overlying the conductive loaded resin-based leads 104 and 108. More particularly, the solderable layer 106 and 110 comprises a metal layer that is plated or coated onto the leads 104 and 108. If the method of formation is metal plating, then the resin-based structural material of the conductive loaded, resin-based material 104 and 108 is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer 106 and 110 may be formed by, for example, electroplating or physical vapor deposition.

Figure 2:
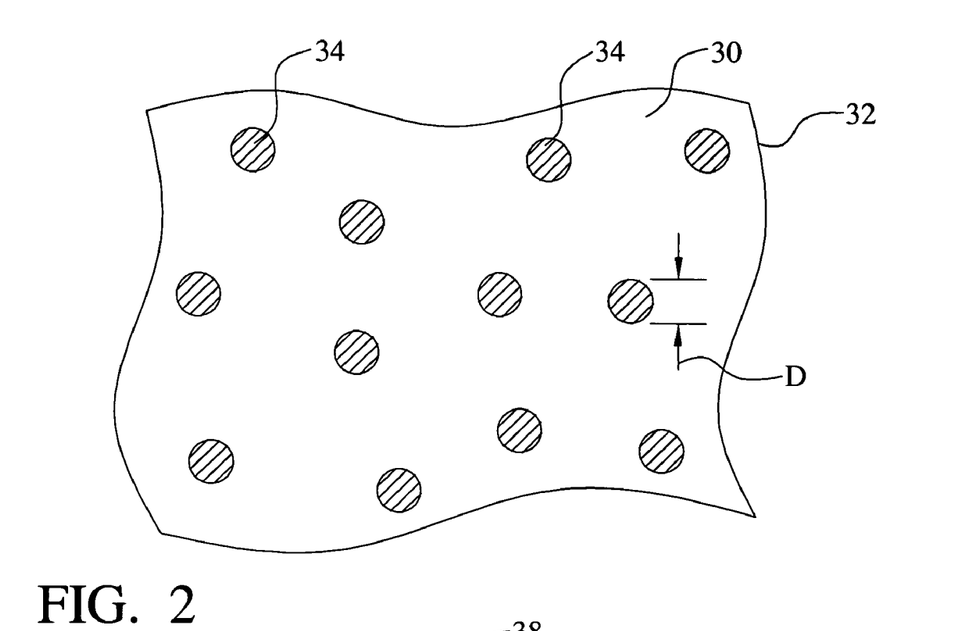
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
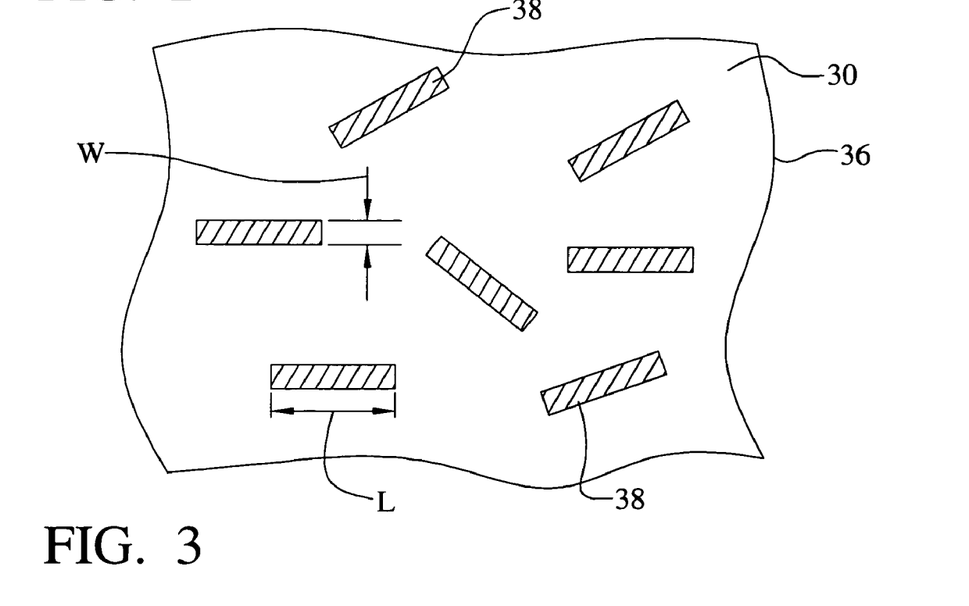
FIG. 3 illustrates a second preferred embodiment of a conductive loaded resin-based material wherein the conductive materials comprise micron conductive fibers.
Figure 4:
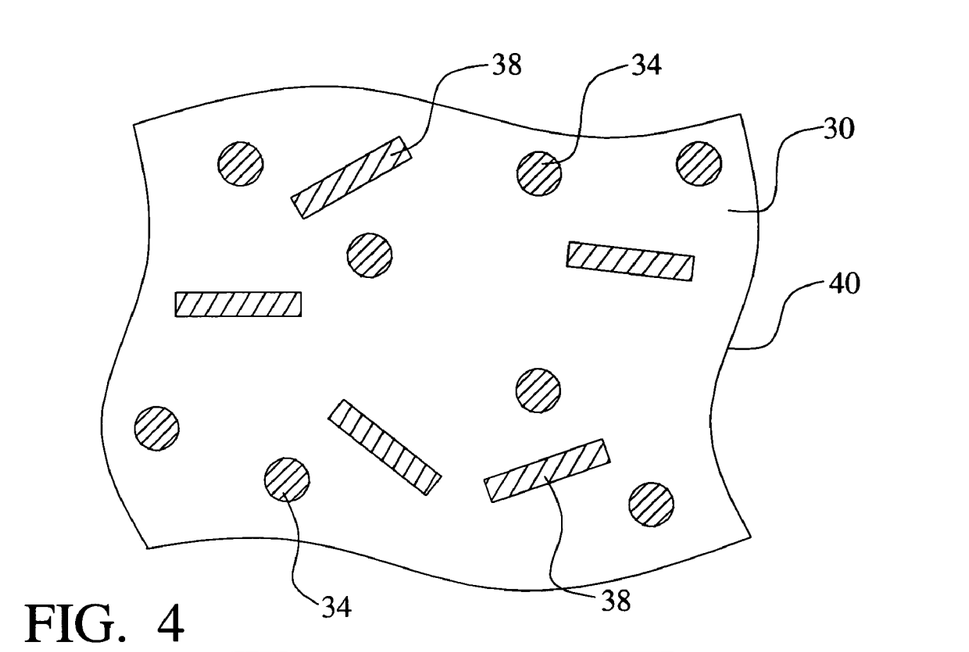
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8–11 micron in diameter and lengths of 4–6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
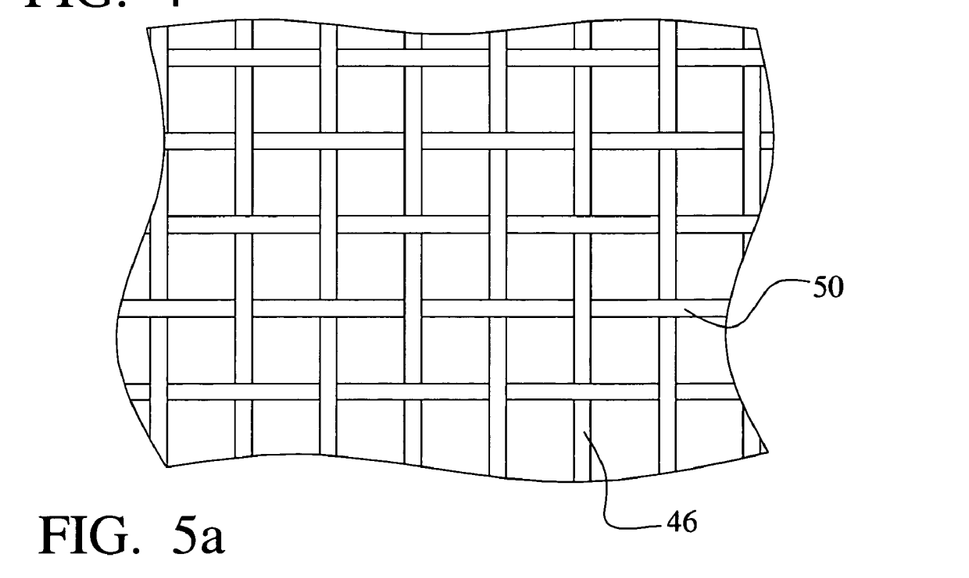
FIGS. 5a and 5b illustrate a fourth preferred embodiment wherein conductive fabric-like materials are formed from the conductive loaded resin-based material.
Figure 5B:
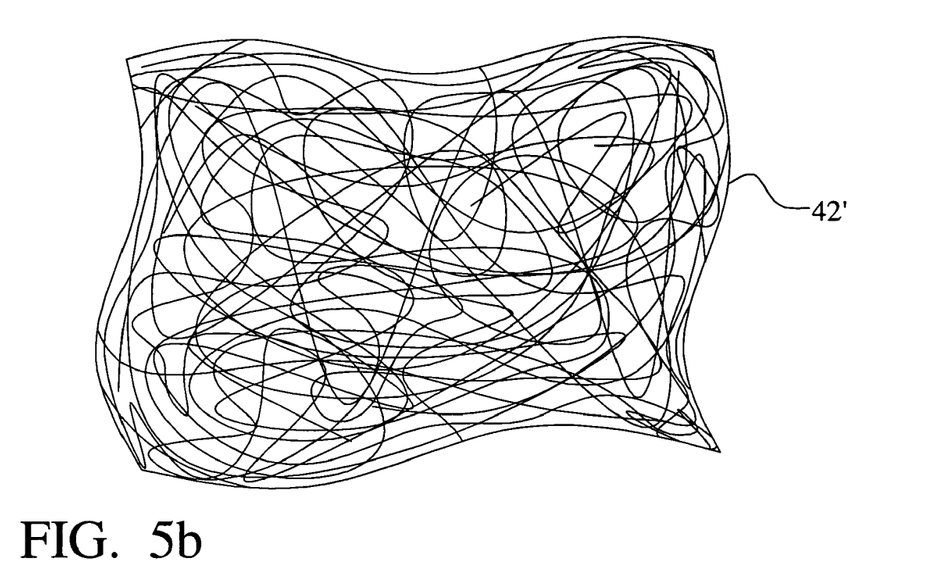

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
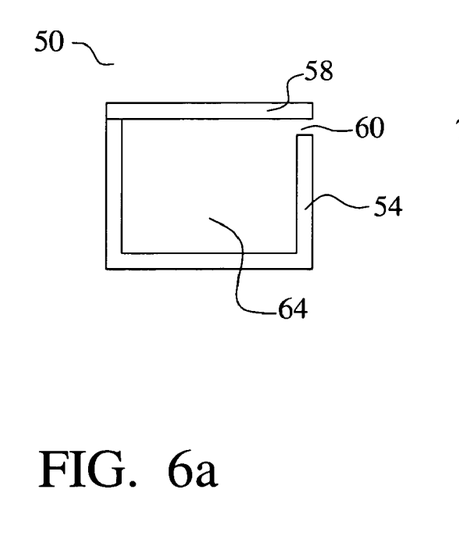
FIGS. 6a and 6b illustrate, in simplified schematic form, an injection molding apparatus and an extrusion molding apparatus that may be used to mold capacitors of a conductive loaded resin-based material.

Capacitors formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the capacitors are removed.

Figure 6B:
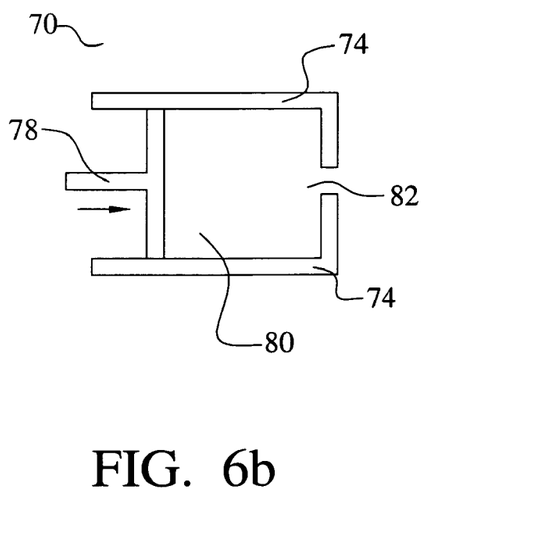

FIG. 6b shows a simplified schematic diagram of an extruder 70 for forming capacitors using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. Effective capacitors are achieved. A method to form capacitors is achieved. The capacitors are molded of conductive loaded resin-based materials. The capacitor characteristics can be altered or the visual characteristics can be altered by forming a metal layer over the conductive loaded resin-based material. Methods to fabricate capacitors from conductive loaded resin-based material incorporate various forms of the material. A method is developed to fabricate capacitors from conductive loaded resin-based material where the material is in the form of a fabric. A method to replace discrete capacitors with capacitors molded into a circuit is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A capacitor device comprising:
   a first plate comprising a conductive loaded, resin-based material comprising conductive materials substantially homogeneously mixed in a base resin host; and
   a second plate fixably held nearby but not contacting said first plate such that said first plate and said second plate are capacitively coupled wherein one of said first and second plates further comprises a circuit trace on a molded circuit board.

2. The device according to claim 1 wherein the ratio, by weight, of said conductive materials to said resin host is between about 0.20 and about 0.40.

3. The device according to claim 1 wherein said conductive materials comprise metal powder.

4. The device according to claim 3 wherein said metal powder is nickel, copper, or silver.

5. The device according to claim 3 wherein said metal powder is a non-conductive material with a metal plating.

6. The device according to claim 5 wherein said metal plating is nickel, copper, silver, or alloys thereof.

7. The device according to claim 3 wherein said metal powder comprises a diameter of between about 3 µm and about 12 µm.

8. The device according to claim 1 wherein said conductive materials comprise non-metal powder.

9. The device according to claim 8 wherein said non-metal powder is carbon, graphite, or an amine-based material.

10. The device according to claim 1 wherein said conductive materials comprise a combination of metal powder and non-metal powder.

11. The device according to claim 1 wherein said conductive materials comprise micron conductive fiber.

12. The device according to claim 11 wherein said micron conductive fiber is nickel plated carbon fiber, stainless steel fiber, copper fiber, silver fiber or combinations thereof.

13. The device according to claim 11 wherein said micron conductive fiber has a diameter of between about 3 µm and about 12 µm and a length of between about 2 mm and about 14 mm.

14. The device according to claim 1 wherein said conductive materials comprise a combination of conductive powder and conductive fiber.

15. The device according to claim 1 further comprising a dielectric material between said first and second plates.

16. The device according to claim 15 wherein said dielectric material comprises a resin-based material.

17. The device according to claim 15 wherein said dielectric material comprises ceramic or mica.

18. The device according to claim 15 wherein said dielectric material comprises paper.

19. The device according to claim 15 wherein said dielectric layer further encapsulates said first and second plates.

20. The device according to claim 1 wherein said first plate and said second plate comprise multiple material planes that are interlaced to increase parallel surfaces therebetween.

21. The device according to claim 1 further comprising a solderable layer overlying part of said first and second plates.

22. The device according to claim 1 wherein one of said first and second plates further comprises a part of a molded housing for an electrical device.

23. A capacitor device comprising:
a first plate comprising a conductive loaded, resin-based material comprising conductive materials substantially homogeneously mixed in a base resin host and wherein said conductive materials comprise stainless steel fiber;
a second plate comprising said conductive loaded, resin-based material; and
a solderable layer overlying part of said first and second plates.

24. The device according to claim 23 wherein said conductive materials further comprise metal powder.

25. The device according to claim 24 wherein said metal powder is a non-conductive material with a metal plating.

26. The device according to claim 23 wherein said conductive materials further comprise non-metal powder.

27. The device according to claim 23 wherein said conductive materials further comprise a combination of metal powder and non-metal powder.

28. The device according to claim 23 wherein said dielectric material comprises a resin-based material.

29. The device according to claim 23 wherein said dielectric material comprises ceramic or mica.

30. The device according to claim 23 wherein said dielectric material comprises paper.

31. The device according to claim 23 wherein said dielectric layer further encapsulates said first and second plates.

32. The device according to claim 23 wherein said first plate and said second plate comprise multiple material planes that are interlaced to increase parallel surfaces therebetween.

33. The device according to claim 23 wherein one of said first and second plates further comprises a circuit trace on a molded circuit board.

34. The device according to claim 23 wherein one of said first and second plates further comprises a part of a molded housing for an electrical device.

35. A method to form a plate of a capacitor device, said method comprising:
providing a conductive loaded, resin-based material comprising conductive materials in a resin-based host; and
forming said conductive loaded, resin-based material into a plate for a capacitor device.

36. The method according to claim 35 wherein the ratio, by weight, of said conductive materials to said resin host is between about 0.20 and about 0.40.

37. The method according to claim 35 wherein the conductive materials comprise a conductive powder.

38. The method according to claim 35 wherein said conductive materials comprise a micron conductive fiber.

39. The method according to claim 35 wherein said conductive materials comprise a combination of conductive powder and conductive fiber.

40. The method according to claim 35 wherein said forming comprises:
injecting said conductive loaded, resin-based material into a mold;
curing said conductive loaded, resin-based material; and
removing said plate from said mold.

41. The method according to claim 40 further comprising forming a dielectric layer over said plate.

42. The method according to claim 41 wherein said step of forming a dielectric layer comprises over-molding.

43. The method according to claim 41 wherein said step of forming a dielectric layer comprises dipping, spraying, or coating.

44. The method according to claim 35 further comprising forming a dielectric layer prior to said step of injecting said conductive loaded, resin-based material into a mold wherein said plate is over-molded onto said dielectric layer.

45. The method according to claim 35 wherein said forming comprises:
loading said conductive loaded, resin-based material into a chamber;
extruding said conductive loaded, resin-based material out of said chamber through a shaping outlet; and
curing said conductive loaded, resin-based material to form said plate.

46. The method according to claim 45 further comprising stamping or milling said molded conductive loaded, resin-based material.

47. The method according to claim 45 further comprising forming a dielectric layer over said plate.

48. The method according to claim 47 wherein said step of forming a dielectric layer comprises extrusion.

49. The method according to claim 47 wherein said step of forming a dielectric layer comprises dipping, spraying, or coating.

* * * * *